(12) United States Patent
Watanabe et al.

(10) Patent No.: US 9,450,002 B2
(45) Date of Patent: Sep. 20, 2016

(54) DETECTING APPARATUS AND DETECTING SYSTEM

(71) Applicant: CANON KABUSHIKI KAISHA, Tokyo (JP)

(72) Inventors: Minoru Watanabe, Honjo (JP); Chiori Mochizuki, Sagamihara (JP); Keigo Yokoyama, Honjo (JP); Masato Ofuji, Honjo (JP); Jun Kawanabe, Kumagaya (JP); Kentaro Fujiyoshi, Tokyo (JP); Hiroshi Wayama, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 14/048,200

(22) Filed: Oct. 8, 2013

(65) Prior Publication Data

US 2014/0097348 A1    Apr. 10, 2014

(30) Foreign Application Priority Data

Oct. 9, 2012   (JP) ................... 2012-224238
Aug. 26, 2013  (JP) ................... 2013-174676

(51) Int. Cl.
*H01L 27/146* (2006.01)

(52) U.S. Cl.
CPC ... *H01L 27/14612* (2013.01); *H01L 27/14663* (2013.01)

(58) Field of Classification Search
CPC .................................................. H01L 27/146
See application file for complete search history.

(56) References Cited

U.S. PATENT DOCUMENTS

| | | | |
|---|---|---|---|
| 6,185,274 B1* | 2/2001 | Kinno et al. | 378/98.8 |
| 8,040,416 B2 | 10/2011 | Fukuoka | |
| 8,483,359 B2* | 7/2013 | Fujita et al. | 378/98.8 |
| 8,570,413 B2* | 10/2013 | Matsui | G02F 1/13338 250/208.1 |
| 2010/0002110 A1 | 1/2010 | Ota | |

FOREIGN PATENT DOCUMENTS

| | | |
|---|---|---|
| CN | 101543059 A | 9/2009 |
| CN | 101933322 A | 12/2010 |
| JP | 11-307756 A | 11/1999 |
| JP | 2005-175418 A | 6/2005 |

\* cited by examiner

*Primary Examiner* — David Porta
*Assistant Examiner* — Faye Boosalis
(74) *Attorney, Agent, or Firm* — Canon U.S.A. Inc., IP Division

(57) ABSTRACT

A detecting apparatus formed on a substrate, includes a plurality of pixels arranged in a matrix, and a signal line electrically connected to the pixels. Each of the pixels includes a sensing element that converts radiant ray or light to electric charges, an amplification thin film transistor that outputs an electric signal based on an amount of the electric charges, a capacitor that holds an electric signal output by the amplification thin film transistor, and a transfer thin film transistor that transfers an electric signal held in the capacitor to the signal line.

18 Claims, 11 Drawing Sheets

DETECTING APPARATUS AND DETECTING SYSTEM

BACKGROUND

1. Field

Aspects of the present invention are generally related to medical image diagnosis apparatuses, non-destructive inspection systems, detecting apparatuses applicable to an apparatus for analyzing with radiant rays, and detecting systems.

2. Description of the Related Art

In recent years, thin-film semiconductor manufacturing has been applied to detecting apparatuses and radiant ray detecting apparatuses each including a combination of a switching device such as a thin film transistor (TFT) and a sensing element such as a photoelectric conversion element. Such a detecting apparatus or a radiant ray detecting apparatus may have a large area of 35 cm×43 cm or 43 cm×43 cm. For improved sensitivity, detecting apparatuses have been proposed which structurally include Active Pixel Sensor (APS) type pixels as disclosed in Japanese Patent Laid-Open No. 11-307756 or 2005-175418. In an APS type pixel, electric charges generated in a sensing element define a potential of a gate of a switching device for amplification. When a switching device for selection is brought into conduction, the voltage according to the potential of the gate defined by a follower operation charges a parasitic capacitance of a signal line. Thus, an electric signal amplified in accordance with an amount of the electric charges generated in the sensing element is output from the pixel to the signal line. In other words, in a detecting apparatus having APS type pixels as disclosed in Japanese Patent Laid-Open No. 11-307756 or 2005-175418, the amplification degree of or the time for outputting electric signals from the pixels depends on a parasitic capacitance of a signal line.

However, according to Japanese Patent Laid-Open No. 11-307756 or Japanese Patent Laid-Open No. 2005-175418, the value of a parasitic capacitance of a signal line may vary in accordance with the area of the detecting apparatus including them or the width of a signal line therein, which may possibly changes the amplification degree of or the time for outputting electric signals output from pixels. The amplification degree and the outputting time may be adjusted by adjusting the parasitic capacitance of a signal line irrespective of the apparatus including them through adjustment of the area of the apparatus and the width of the signal line. However, in consideration of noise that depends on the parasitic capacitance of a signal line, the parasitic capacitance of the signal line is required to be extremely low. Therefore, in a design that adjusts the parasitic capacitance of a signal line, it is not easy to keep a preferable S/N ratio and also keep a desired amplification degree of or time for outputting electric signals. Particularly in a detecting apparatus having a large area produced by thin-film semiconductor manufacturing, the parasitic capacitance of signal line may change as largely as 50 to 150 pF due to a change of the area, for example, and the parasitic capacitance of the signal line may significantly affect.

SUMMARY

Accordingly, aspects of the present invention generally provide a detecting apparatus or a radiant ray detecting apparatus having APS type pixels manufactured by thin-film semiconductor manufacturing, whereby a desired amplification degree or and time for outputting an electric signal may easily be provided with a preferable S/N ratio.

According to an aspect of the present invention, a detecting apparatus formed on a substrate, includes a plurality of pixels arranged in a matrix, and a signal line electrically connected to the pixels. Each of the pixels includes a sensing element that converts radiant ray or light to electric charges, an amplification thin film transistor that outputs an electric signal based on an amount of the electric charges, a capacitor that holds an electric signal output by the amplification thin film transistor, and a transfer thin film transistor that transfers an electric signal held in the capacitor to the signal line.

Further features of the present disclosure will become apparent from the following description of exemplary embodiments with reference to the attached drawings.

DESCRIPTION OF THE EMBODIMENTS

Exemplary embodiments will be specifically described below with reference to appended drawings. Radiant rays include herein not only beams that generate particles (including photons) arise from the radioactive decay, such as an α-ray, a β-ray, and a γ-ray, but also beams having comparable energy, such as an X-ray, a particle ray, and a cosmic ray.

[First Embodiment]

Figure 1A:
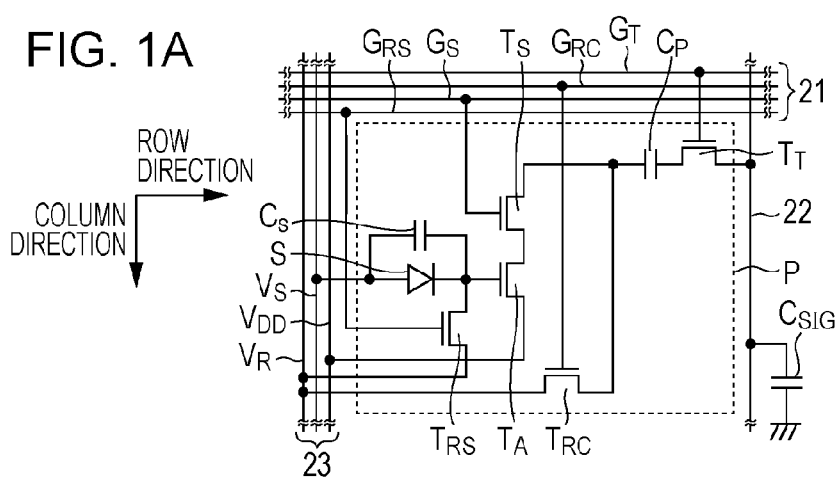
FIG. 1A is schematic equivalent circuit diagram of one pixel in a detecting apparatus according to a first embodiment.

First, a detecting apparatus according to a first embodiment will be described with reference to FIGS. 1A, 1B, and 1C. FIG. 1A is schematic equivalent circuit diagram of one pixel in a detecting apparatus according to a first embodiment, FIG. 1B is an overall schematic equivalent circuit diagram, and FIG. 1C is a schematic equivalent circuit diagram of a readout circuit.

Figure 1B:
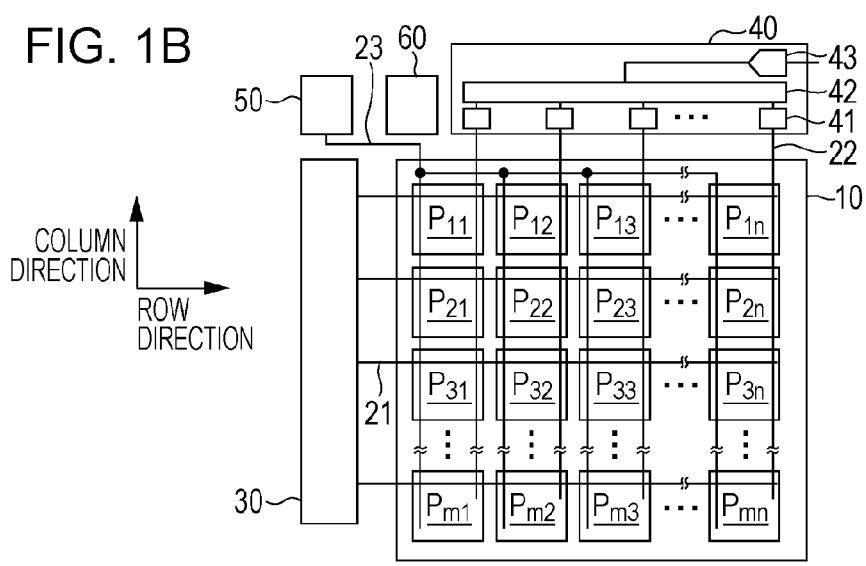
FIG. 1B is an overall schematic equivalent circuit diagram.
Figure 1C:
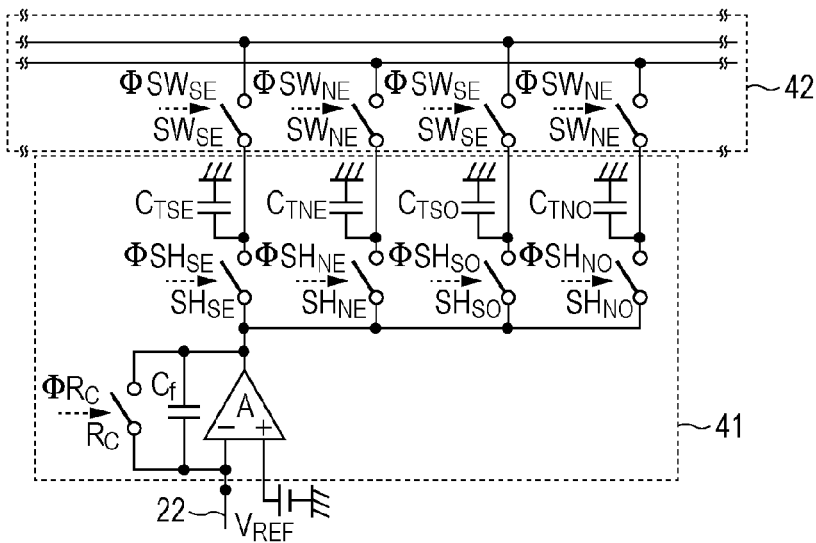
FIG. 1C is a schematic equivalent circuit diagram of a readout circuit.

As illustrated in FIG. 1B, a detecting apparatus according to this embodiment includes a plurality of arrays of pixels P in matrix on a surface of a substrate 10. Each of the pixels P includes a sensing element S, a thin film transistor $T_A$ for amplification (called an amplification thin film transistor $T_A$), a thin film transistor $T_S$ for selection (called a selection thin film transistor $T_S$), and a thin film transistor $T_{RS}$ for reset (called a reset thin film transistor $T_{RS}$), as illustrated in FIG. 1A. The sensing element S converts radiant ray or light to electric charges and may be a photoelectric conversion element such as a PIN-type photodiode, and the sensing element S has one electrode electrically connected to an electrode power supply line $V_S$. The amplification thin film transistor $T_A$ outputs an electric signal based on electric charges generated in the sensing element and has a gate that receives the electric charges generated in the sensing element. According to this embodiment, the amplification thin film transistor $T_A$ has a gate electrically connected to another electrode of the sensing element S and one of a source and a drain electrically connected to an operating power line $V_{DD}$. The selection thin film transistor $T_S$ allows selection of a pixel and transfers an electric signal based on the electric charges received by the gate of the amplification thin film transistor $T_A$ when it is brought into conduction. The selection thin film transistor $T_S$ has a gate electrically connected to a drive line $G_S$ for selection (called a selection drive line $G_S$) and one of the source and drain electrically connected to another one of a source and a drain of the amplification thin film transistor $T_A$. The reset thin film transistor $T_{RS}$ may at least reset the gate of the amplification thin film transistor $T_A$ and may also reset the sensing element S according to this embodiment. The reset thin film transistor $T_{RS}$ has a gate electrically connected to a drive line $G_{RS}$ for reset (called a reset drive wiring GRS), one of a source and a drain to the reset power supply line $V_R$ and the other of the source and drain to the other electrode of the sensing element S and the gate of the amplification thin film transistor $T_A$. Each of the pixels P further includes a capacitor $C_P$, a thin film transistor $T_T$ for transfer (called a transfer thin film transistor $T_T$) and a thin film transistor $T_{RC}$ for capacitance reset (called a capacitance reset thin film transistor $T_{RC}$). The capacitor $C_P$ holds an electric signal output from the amplification thin film transistor $T_A$ and has one electrode electrically connected to another one of a source and drain of the selection thin film transistor $T_S$. When the selection thin film transistor $T_S$ is brought into conduction, the capacitor $C_P$ has one electrode electrically connected to another one of the source and drain of the amplification thin film transistor $T_A$. The transfer thin film transistor $T_T$ transfers an electric signal held in the capacitor $C_P$ to a signal line 22. The transfer thin film transistor $T_T$ has a gate electrically connected to a drive line $G_T$ for transfer (called a transfer drive line $G_T$), one of a source and a drain to the capacitor $C_P$, and the other one of the source and drain to the signal line 22. According to this embodiment, the transfer thin film transistor $T_T$ has one of a source and a drain electrically connected to another electrode of the capacitor $C_P$. The capacitance reset thin film transistor $T_{RC}$ resets the capacitor $C_P$ and resets one electrode of the capacitor $C_P$ according to this embodiment. The capacitance reset thin film transistor $T_{RC}$ has a gate electrically connected to a drive line $G_{RC}$ for capacitance reset (called capacitance reset drive line $G_{RC}$) and one of a source and a drain to the reset power supply line $V_R$ and the other one of the source and drain to the capacitor $C_P$. According to this embodiment, the capacitance reset drive line $G_{RC}$ has the other one of the source and drain electrically connected to one electrode of the capacitor $C_P$.

In a pixel of this embodiment, an electric signal amplified by the amplification thin film transistor $T_A$ is output to the capacitor $C_P$ for which a desired capacitance is settable, and the electric signal output to the capacitor $C_P$ is transferred by the transfer thin film transistor $T_T$ from the pixel to the signal line 22. Here, in a detecting apparatus having APS type pixels manufactured by thin-film semiconductor manufacturing, the value of the parasitic capacitance of the signal line 22 is larger than the capacitance of the capacitor $C_P$ by approximately three digits. The amount of variation in parasitic capacitance of the signal line 22 based on a change in area of the detecting apparatus is also larger than the capacitance of the capacitor $C_P$ by approximately three digits. According to this embodiment, the amplification degree of or the time for outputting an electric signal may substantially be defined by the capacitance of the capacitor $C_P$, eliminating the necessity for consideration of the parasitic capacitance of the signal line 22. This may prevent an influence of a variation in parasitic capacitance of the signal line 22 based on a change in area of the detecting apparatus if any. The sufficient time for outputting an electric signal requires approximately 200 µsecond without the configuration of this embodiment where the capacitance of the sensing element S is 0.5 to 1.5 pF and the parasitic capacitance of the signal line 22 is 60 to 150 pF. On the other hand, with the configuration of this embodiment, the sufficient output time may be approximately 1 µsecond or shorter by setting the capacitance of the capacitor $C_P$ to 1.5 to 15 pF. Also, a sufficient amplification degree may be provided therefor. According to the present embodiment, the selection thin film transistor $T_S$ and capacitance reset thin film transistor $T_{RC}$ are not necessary but are preferably provided. The reset thin film transistor $T_{RS}$ is necessary for performing an operation, which will be described below, a plurality of numbers of time. However, the reset thin film transistor $T_{RS}$ is not necessary in an apparatus which performs the operation only once.

A drive line group 21 includes a plurality of kinds of drive line and, according to this embodiment, includes the selection drive line $G_S$, reset drive line $G_{RS}$, transfer drive line $G_T$ and capacitance reset drive line $G_{RC}$. The selection drive line $G_S$ transmits a selection drive signal which controls the conduction state of the selection thin film transistors $T_S$ for selecting pixels P row by row from a drive circuit 30, which will be described below, to the gate of the selection thin film transistor $T_S$. The reset drive line $G_{RS}$ transmits a reset drive signal which controls the conduction state of the reset thin film transistors $T_{RS}$ row by row from the drive circuit 30 to the gate of the reset thin film transistor $T_{RS}$. The transfer drive line $G_T$ transmits a transfer drive signal from the drive circuit 30 to the gate of the transfer thin film transistor $T_T$. The transfer drive signal controls the conduction state of the transfer thin film transistors $T_T$ for transferring electric signals held in the capacitors $C_P$ row by row to the signal line 22. The capacitance reset drive line $G_{RC}$ transmits a capacitance reset drive signal from the drive circuit 30 to the gate of the capacitance reset thin film transistor $T_{RC}$. The capacitance reset drive signal controls the conduction state of the capacitance reset thin film transistors $T_{RC}$ for resetting the capacitors $C_P$ row by row. The signal line 22 transmits an electric signal transferred from a pixel to a readout circuit 40, which will be described below. The power supply line group 23 includes a plurality of kinds of power supply line and, according to this embodiment, includes the electrode power supply line $V_S$, operating power line $V_{DD}$ and reset power supply line $V_R$. The electrode power supply line $V_S$ transmits a desired potential from a power supply circuit 50, which will be described below, to one electrode of the sensing element S such that a desired voltage at which the sensing element S may convert radiant ray or light to electric charges may be applied to the sensing element S. The operating power line $V_{DD}$ transmits operating voltage at which the amplification thin film transistor $T_A$ may perform a charge amplification operation as in a source follower from the power supply circuit 50 to one of the source and drain of the amplification thin film transistor $T_A$. The reset power supply line $V_R$ transmits a predetermined potential for resetting the gate of the amplification thin film transistor $T_A$ from the power supply circuit 50 to one of the source and drain of the reset thin film transistor $T_{RS}$. According to this embodiment, the reset power supply line $V_R$ transmits a predetermined potential for resetting one electrode of the capacitor $C_P$ from the power supply circuit 50 to one of the source and drain of the capacitance reset thin film transistor $T_{RC}$. However, the present embodiment is not limited thereto. An additional line may be provided which may receive a predetermined potential for transmitting a predetermined potential for resetting one electrode of the capacitor $C_P$ from the power supply circuit 50 to one of the source and drain of the capacitance reset thin film transistor $T_{RC}$. More specifically, one of the source and drain of the capacitance reset thin film transistor $T_{RC}$ may be electrically connected to a line which may receive a predetermined potential.

According to this embodiment, as illustrated in FIG. 1B, a pixel array includes a plurality of pixels $P_{11}$ to $P_{mn}$ including n pixels in the row direction and m pixels in the column direction. The drive line group 21 is commonly electrically connected to a plurality of pixels P provided in the row direction, and a plurality of drive line groups 21 are aligned in the column direction. The signal line 22 is commonly electrically connected to a plurality of pixels P provided in the column direction, and a plurality of signal lines 22 are aligned in the row direction. The power supply line group 23 is commonly electrically connected to a plurality of, more specifically, n×m pixels P. The drive circuit 20 is electrically connected to the plurality of drive line groups 21, and the drive circuit 20 supplies the drive signals as described above to the plurality of drive line groups 21. The power supply circuit 50 is electrically connected to the power supply line group 23, and the power supply circuit 50 supplies the potentials as described above to the power supply line group. The configuration which allows changing the potential to be supplied from the power supply circuit 50 to the operating power line $V_{DD}$ may allow changing the amplification degrees of pixels. The configuration which allows changing the potential to be supplied from the power supply circuit 50 to the electrode power supply line $V_S$ may allow changing the sensitivity of the sensing elements S. The readout circuit 40 is connected to the plurality of signal lines 22, and the readout circuit 20 converts and outputs electric signals output from a pixel array in parallel to serial digital signals. The readout circuit 40 includes an amplifier circuit 41, a multiplexer 42, and an A/D converter 43. The amplifier circuit 41 is a circuit that amplifies and holds an electric signal transmitted via the signal line 22 and may be capable of performing Correlated Double Sampling. The multiplexer 42 is a circuit that converts electric signals output in parallel from a pixel array and amplified in the amplifier circuit 41 to serial electric signals. The A/D converter 43 is a circuit that converts an analog electric signal to a digital signal and, according to this embodiment, converts serial electric signals output from the multiplexer 42 to digital signals. However, the present embodiment is not limited thereto, but the A/D converter 43 may be provided for each of the signal lines 22. The amplifier circuit 41 and multiplexer 42 will be described below in detail with reference to FIG. 1C. A control circuit 60 is a circuit that supplies control signals to the drive circuit 30, readout circuit 40, and power supply circuit 50 to control the drive circuit 30, readout circuit 40, and power supply circuit 50 and thus control an operation of the pixel array.

Next, with reference to FIG. 1C, the amplifier circuit 41 and multiplexer 42 will be described. The amplifier circuit 41 includes an integral amplifier including an operational amplifier A that amplifies and outputs a read electric signal, an integral capacitance $C_f$, and a reset switch $R_C$ that resets the integral capacitance $C_f$ and the signal line 22. The operational amplifier A has an inverting input terminal to which the signal line 22 is electrically connected and receives an electric signal transmitted via the signal line 22 and outputs an amplified electric signal through its output terminal. The operational amplifier A has a forward input terminal to which a reference power supply Vref1 is electrically connected. A control signal $\Phi R_C$ is supplied from the control circuit 60 illustrated in FIG. 1B to the reset switch $R_C$ for controlling the time for resetting the integral capacitance $C_f$ and signal line 22. The use of the amplifier circuit 41 configured as described above allows designing the amplification degree of and the time for outputting an electric signal to the amplifier circuit 41 independently of the parasitic capacitance of the signal line 22 in a case where the parasitic capacitance of the signal line 22 is sufficiently larger than those of the capacitor $C_P$ and integral capacitance $C_f$. The amplifier circuit 41 further includes four sample hold circuits (hereinafter, called a S/H circuits) each including a sampling switch SH and a sampling capacitance $C_T$ for performing Correlated Double Sampling (CDS) processing of inhibiting an offset occurring in the amplifier circuit 41 for electric signals from two rows. The amplifier circuit 41 of this embodiment includes an S/H circuit for odd-numbered row signals including $SH_{SO}$ and $C_{TSO}$ and an S/H circuit for odd-numbered row noise including $SH_{NO}$ and $C_{TNO}$. The amplifier circuit 41 of this embodiment further includes an S/H circuit for even numbered row signal including $SH_{SE}$ and $C_{TSE}$ and an S/H circuit for even numbered row noise including $SH_{NE}$ and $C_{TNE}$. Control signals $\Phi SH$ are supplied from the control circuit 60 illustrated in FIG. 1B to the sampling switches SH for controlling timing of operations of the S/H circuits. The multiplexer 42 has switches SW for respective sample hold capacitances $C_T$. Each of the switches SW is usable for transferring an electric signal held in the respective sample hold capacitances $C_T$. Control signals $\Phi SW$ are supplied from the control circuit 60 illustrated in FIG. 1B to the switches SW to sequentially select the switches so that an operation of converting parallel signals to serial signals may be performed. According to this embodiment, signal switches $SW_{SE}$ and $SW_{SO}$ are connected to a signal output line, while noise switches $SW_{NE}$ and $SW_{NO}$ are connected to a noise output line. The signal output line and the noise output line are connected to a difference circuit (not illustrated) such as a differential amplifier. Thus, the readout circuit 40 performs CDS processing.

Figure 2A:
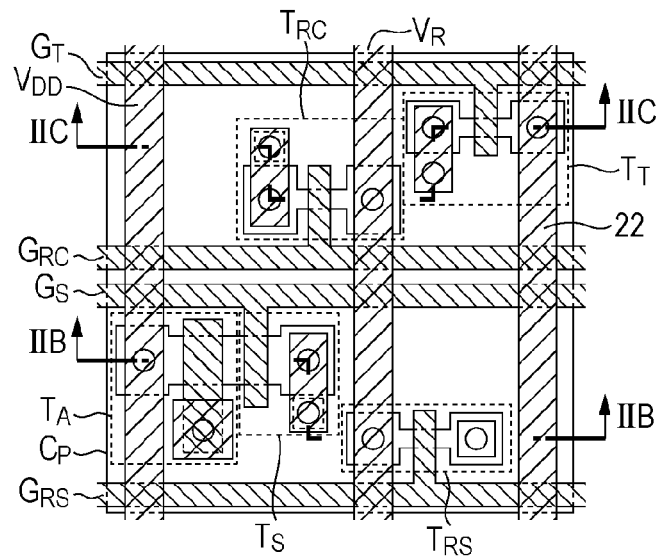
FIG. 2A is a schematic plan view of one pixel in a detecting apparatus according to the first embodiment.
Figure 2B:
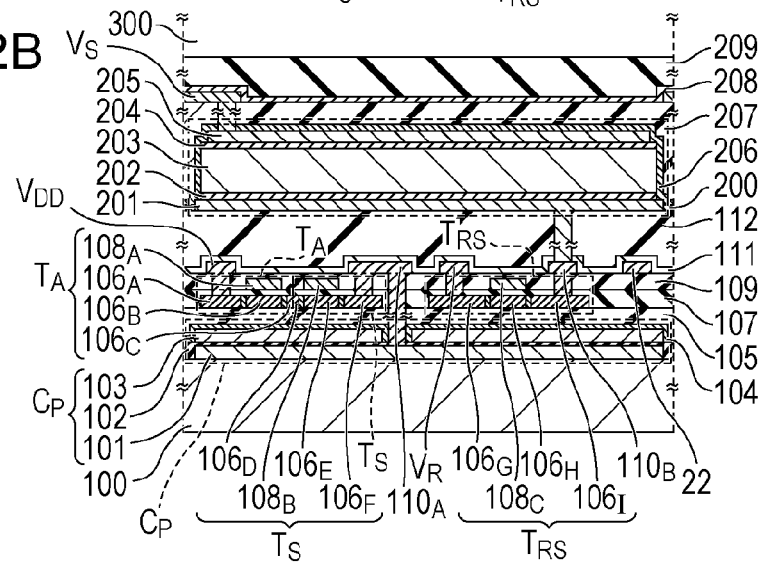
FIGS. 2B and 2C are schematic cross-sectional views.
Figure 2C:
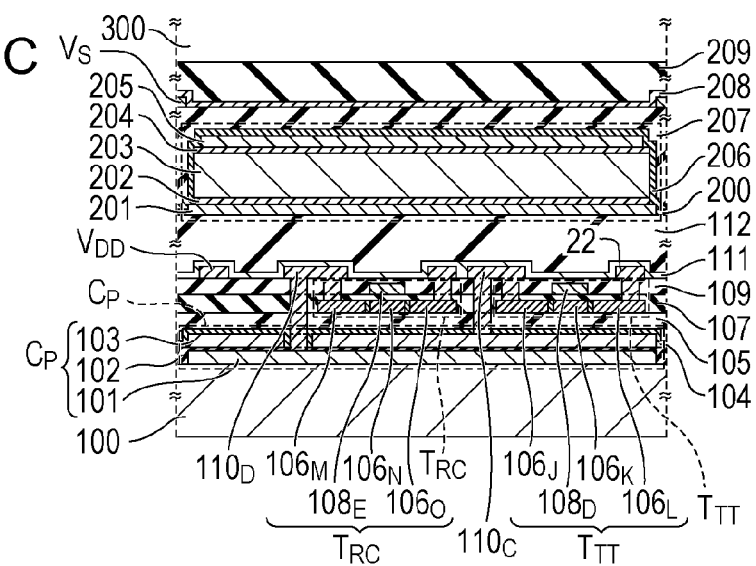

Next, with reference to FIGS. 2A to 2C, a configuration of one pixel of a detecting apparatus according to the first embodiment will be described. FIG. 2A is a schematic plan view of one pixel in a detecting apparatus according to the first embodiment. For simple description, an insulating layer and a sensing element are omitted in FIG. 2A. FIG. 2B is a schematic cross-sectional view taken on the line IIB-IIB in FIG. 2A, and FIG. 2C is a schematic cross-sectional view taken on the line IIC-IIC in FIG. 2A. FIGS. 2B and 2C illustrate an insulating layer and a sensing element that are omitted in FIG. 2A.

As illustrated in FIGS. 2A to 2C, the detecting apparatus according to this embodiment has the amplification thin film transistor $T_A$, selection thin film transistor $T_S$, and reset thin film transistor $T_{RS}$ on a substrate 100 having an insulative surface such as a glass substrate. The sensing element S is placed on the amplification thin film transistor $T_A$, selection thin film transistor $T_S$, and reset thin film transistor $T_{RS}$. The capacitor $C_P$ is placed between the amplification thin film transistor $T_A$, selection thin film transistor $T_S$, and reset thin film transistor $T_{RS}$ and the substrate 100. Because such a surface of the substrate 100 has higher flatness than those of the amplification thin film transistor $T_A$, selection thin film transistor $T_S$, and reset thin film transistor $T_{RS}$, the capacitor $C_P$ may be disposed on a flatter surface. Thus, the thickness of the insulating layer for use in the capacitor $C_P$ may be reduced more easily than a case where the capacitor $C_P$ is formed on the amplification thin film transistor $T_A$, selection thin film transistor $T_S$, and reset thin film transistor $T_{RS}$.

According to this embodiment, the capacitor $C_P$ includes a first conductive layer 101 placed on the substrate 100, a first insulating layer 102 placed on the first conductive layer 101 and a second conductive layer 103 placed on the first insulating layer 102. The first conductive layer 101 and second conductive layer 103 may be formed of a material having a melting point that may withstand a high temperature process of manufacture processes for the thin film transistor and sensing element. The first conductive layer 101 and second conductive layer 103 may be formed of a light transmissive conductive material such as a polycrystalline semiconductor containing transparent conducting oxide such as ITO and impurities in view of a case where polycrystalline silicon is used for each thin film transistor or anti-afterimage through irradiation of light to the sensing element S. In view of the amplification degree of and the time for outputting an electric signal, the capacitance of the capacitor $C_P$ is desirably 3 to 10 times of the capacitance of the sensing element S and is desirably 1/30 to 1/10 of the parasitic capacitance of the signal line 22. Because the capacitor $C_P$ is placed between the thin film transistors and the substrate, the capacitor $C_P$ may have a substantially equal area to that of the sensing element S. Silicon nitride ($\epsilon$=6 to 7.5) having a high heat-resistance may be used as a material of the first insulating layer 102 when polycrystalline silicon is used for forming the thin film transistors. In such a configuration, when the sensing element S includes a semiconductor layer that is a PIN-type photodiode of amorphous silicon ($\epsilon$=12), the thickness of the first insulating layer 102 is desirably 1/10 to 1/3 of the thickness of the semiconductor layer of the sensing element S. When the sensing element S includes a semiconductor layer that is a PIN-type photodiode of amorphous silicon ($\epsilon$=12), the thickness of the semiconductor layer of the sensing element S is desirably 500 to 1500 nm, and the thickness of the first insulating layer 102 is desirably 50 to 150 nm.

According to this embodiment, a first passivation layer 104 and a first interlayer insulating layer 105 are placed on the capacitor $C_P$ in a manner that they may cover the capacitor $C_P$. The thin film transistors of polycrystalline silicon are placed on the first interlayer insulating layer 105. These materials may be high heat-resistant silicon nitride ($\epsilon$=6 to 7.5) when polycrystalline silicon is used for forming the thin film transistors. In this case, the thicknesses of the first passivation layer 104 and first interlayer insulating layer 105 may be thicker than the thickness of the first insulating layer 102 to reduce the parasitic capacitance between the thin film transistors and the capacitor $C_P$. When the thickness of the first insulating layer 102 is 50 to 150 nm as described above, the thicknesses of the first passivation layer 104 and first interlayer insulating layer 105 are preferably 300 to 1000 nm, and the thickness of the first insulating layer 102 is preferably 6 to 20 times.

As illustrated in FIG. 2A, the amplification thin film transistor $T_A$ includes an impurity semiconductor region $106_A$, an intrinsic semiconductor region $106_B$, and an impurity semiconductor region $106_C$ in a land-shaped polycrystalline silicon layer on the first interlayer insulating layer 105.

Here, the impurity semiconductor region $106_A$, intrinsic semiconductor region $106_B$, and impurity semiconductor region $106_C$ may be one of a source and a drain of the amplification thin film transistor $T_A$, a channel, and the other one of the source and drain. The amplification thin film transistor $T_A$ further includes a gate insulating layer 107 placed on the polycrystalline silicon layer in a manner that it may cover the land-shaped polycrystalline silicon layer and a gate $108_A$ placed on the gate insulating layer 107. Next, the selection thin film transistor $T_S$ includes an impurity semiconductor region $106_D$, an intrinsic semiconductor region $106_E$, and an impurity semiconductor region $106_F$ which are provided in the land-shaped polycrystalline silicon layer on the first interlayer insulating layer 105. Here, the impurity semiconductor region $106_D$, intrinsic semiconductor region $106_E$, and impurity semiconductor region $106_F$ may be one of a source and a drain of the selection thin film transistor $T_S$, a channel, and the other one of the source and drain. The selection thin film transistor $T_S$ further includes the gate insulating layer 107 and a gate $108_B$ placed on the gate insulating layer 107. Next, the reset thin film transistor $T_{RS}$ includes an impurity semiconductor region $106_G$, an intrinsic semiconductor region $106_H$, and an impurity semiconductor region $106_I$ which are provided in the land-shaped polycrystalline silicon layer on the first interlayer insulating layer 105. Here, the impurity semiconductor region $106_G$, intrinsic semiconductor region $106_H$, and impurity semiconductor region $106_I$ may be the other one of the source and drain of the reset thin film transistor $T_{RS}$, a channel and one of the source and drain. The reset thin film transistor $T_{RS}$ further includes the gate insulating layer 107 and a gate $108_C$ placed on the gate insulating layer 107.

Next, as illustrated in FIG. 2B, the transfer thin film transistor $T_T$ includes an impurity semiconductor region $106_J$, an intrinsic semiconductor region $106_K$, and an impurity semiconductor region $106_L$, which are provided in the land-shaped polycrystalline silicon layer on the first interlayer insulating layer 105. Here, the impurity semiconductor region $106_J$, intrinsic semiconductor region $106_K$, and impurity semiconductor region $106_L$, may be one of a source and a drain of the transfer thin film transistor $T_T$, a channel and the other one of the source and drain. The selection thin film transistor $T_S$ further includes the gate insulating layer 107 and a gate $108_D$ placed on the gate insulating layer 107. Next, the capacitance reset thin film transistor $T_{RC}$ includes an impurity semiconductor region $106_M$, an intrinsic semiconductor region $106_N$, and an impurity semiconductor region $106_O$ which are provided in the land-shaped polycrystalline silicon layer on the first interlayer insulating layer 105. Here, the impurity semiconductor region $106_M$, intrinsic semiconductor region $106_N$, and impurity semiconductor region $106_O$ may be one of a source and a drain of the capacitance reset thin film transistor $T_{RC}$, a channel and the other one of the source and drain. The capacitance reset thin film transistor $T_{RC}$ further includes the gate insulating layer 107 and a gate $108_E$ placed on the gate insulating layer 107. A gate of each of the thin film transistors is formed of an electroconductive film prepared for forming the drive line group 21. According to this embodiment, a metal film containing Al is used as the electroconductive film. An LDD region or an offset region may be provided between the source and drain of each of the thin film transistors and channels.

As illustrated in FIG. 2B and FIG. 2C, a second interlayer insulating layer 109 is placed in a matter that it may cover the thin film transistors. The signal line 22, operating power line $V_{DD}$, reset power supply line $V_R$, first connection part $110_A$, second connection part $110_B$, third connection part $110_C$, and the fourth connection part $110_D$ are placed on the second interlayer insulating layer 109. The operating power line $V_{DD}$ is electrically connected to the impurity semiconductor region $106_A$ of the amplification thin film transistor $T_A$ through a contact hole in the gate insulating layer 107 and second interlayer insulating layer 109. The first connection part $110_A$ is electrically connected to the first conductive layer 101 through a contact hole in the first insulating layer 102, second conductive layer 103, first passivation layer 104, first interlayer insulating layer 105, gate insulating layer 107, and second interlayer insulating layer 109. The first connection part $110_A$ is electrically connected to the impurity semiconductor region $106_F$ of the selection thin film transistor $T_S$ through a contact hole in the gate insulating layer 107 and second interlayer insulating layer 109. The reset power supply line $V_R$ is electrically connected to the impurity semiconductor region $106_G$ of the reset thin film transistor $T_{RS}$ through a contact hole in the gate insulating layer 107 and second interlayer insulating layer 109. The reset power supply line $V_R$ is electrically connected to the impurity semiconductor region $106_O$ of the capacitance reset thin film transistor $T_{RC}$ through a contact hole in the gate insulating layer 107 and second interlayer insulating layer 109. The second connection part $110_B$ electrically connected to the impurity semiconductor region $106_I$ of the reset thin film transistor $T_{RS}$ through a contact hole in the gate insulating layer 107 and second interlayer insulating layer 109. The signal line 22 is electrically connected to the impurity semiconductor region $106_L$ of the transfer thin film transistor $T_T$ through a contact hole in the gate insulating layer 107 and second interlayer insulating layer 109. The third connection part $110_C$ is electrically connected to the impurity semiconductor region $106_J$ of the transfer thin film transistor $T_T$ through a contact hole in the gate insulating layer 107 and second interlayer insulating layer 109. The third connection part $110_C$ is electrically connected to the second conductive layer 103 through a contact hole in the first passivation layer 104, first interlayer insulating layer 105, gate insulating layer 107, and second interlayer insulating layer 109. The fourth connection part $110_D$ is electrically connected to the impurity semiconductor region $106_M$ of the capacitance reset thin film transistor $T_{RC}$ through a contact hole in the gate insulating layer 107 and second interlayer insulating layer 109. The fourth connection part $110_D$ is electrically connected to the first conductive layer 101 through a contact hole in the first insulating layer 102, second conductive layer 103, first passivation layer 104, first interlayer insulating layer 105, gate insulating layer 107, and second interlayer insulating layer 109. The signal line 22, operating power line $V_{DD}$, reset power supply line $V_R$, first connection part $110_A$, second connection part $110_B$, third connection part $110_C$, and fourth connection part $110_D$ are formed from a same electroconductive film and, according to this embodiment, are formed from a metallic film containing Al as the electroconductive film.

Next, a second passivation layer 111 is placed in a manner that it may cover the second interlayer insulating layer 109, signal line 22, operating power line $V_{DD}$, reset power supply line $V_R$, first connection part $110_A$, second connection part $110_B$, third connection part $110_C$, and fourth connection part $110_D$. A third interlayer insulating layer 112 is placed on the second passivation layer 111 in a manner that it may cover the second passivation layer 111. The third interlayer insulating layer 112 may contain an organic insulative material which may be formed thick in order to reduce the parasitic capacitance between the signal line 22 and the sensing element S.

As illustrated in FIG. 2B and FIG. 2C, the sensing element S is placed on the third interlayer insulating layer 112. According to this embodiment, a photoelectric conversion element used in the sensing element S includes a first electrode 201, an impurity semiconductor layer 202 of a first conductivity type, a semiconductor layer 203, an impurity semiconductor layer 204 of a second conductivity type, and a second electrode 205 in order from the third interlayer insulating layer 112 side. The first electrode 201 is placed on the third interlayer insulating layer 112 and is electrically connected to the second connection part $110_B$ through a contact hole in the second passivation layer 111 and third interlayer insulating layer 122. The first electrode 201 is electrically connected to the gate $108_A$ of the amplification thin film transistor $T_A$ through a contact hole in the second interlayer insulating layer 109, second passivation layer 111, and third interlayer insulating layer 122 (not illustrated). It should be noted that an insulating member 200 containing an inorganic material may be provided between the first electrodes 201 of the adjacent sensing element S in a manner that the insulating member 200 may cover a surface of the second interlayer insulating layer 109. The impurity semiconductor layer 202 of the first conductivity type exhibits a polarity of the first conductivity type. The impurity concentration of the first conductivity type is higher than the semiconductor layer 203 and the impurity semiconductor layer 204 of the second conductivity type. The semiconductor layer 203 may be an intrinsic semiconductor. The impurity semiconductor layer 204 of the second conductivity type exhibits a polarity of the opposite second conductivity type to the first conductivity type. The impurity concentration of the second conductivity type is higher than the impurity semiconductor layer 202 and semiconductor layer 203 of the first conductivity type. The first conductivity type and the second conductivity type are conductivity types having different polarities from each other. For example, when the first conductivity type is an n-type, the second conductivity type is a p-type. According to this embodiment, a photodiode is used which mainly contains amorphous silicon. However, the present embodiment is not limited thereto. For example, an element containing amorphous selenium may be used which directly converts radiant ray to electric charges. The first electrode 201 and second electrode 205 contain transparent conductive oxide such as light-transmissive ITO. However, the first electrode 201 may contain a metallic material. Particularly, when an indirect sensing element is provided which includes a photoelectric conversion element and a wavelength converter 300, which will be described below, the second electrode 205 that is an electrode close to the wavelength converter 300 contains a transparent conductive oxide. On the other hand, the first electrode 201 that is farther away from the wavelength converter than the second electrode 205 may contain a conductor containing Al having a low optical transparency. According to this embodiment, a third passivation layer 206 is placed in a manner that it may cover a photoelectric conversion element, and a fourth interlayer insulating layer 207 is placed in a manner that it may cover the third passivation layer 206. An electrode power supply line $V_S$ is placed on the fourth interlayer insulating layer 207, and the electrode power supply line $V_S$ is electrically connected to the second electrode 205 through a contact hole in the third passivation layer 206 and fourth interlayer insulating layer 207. A fourth passivation layer 208 and a planarizing layer 209 are placed in a manner that they may cover the fourth interlayer insulating layer 207 and electrode power supply line $V_S$, and the wavelength converter 300 may be placed on the planarizing layer 209. The planarizing layer 209 is an insulating layer for improved surface flatness and may contain an organic insulative material.

Figure 3:
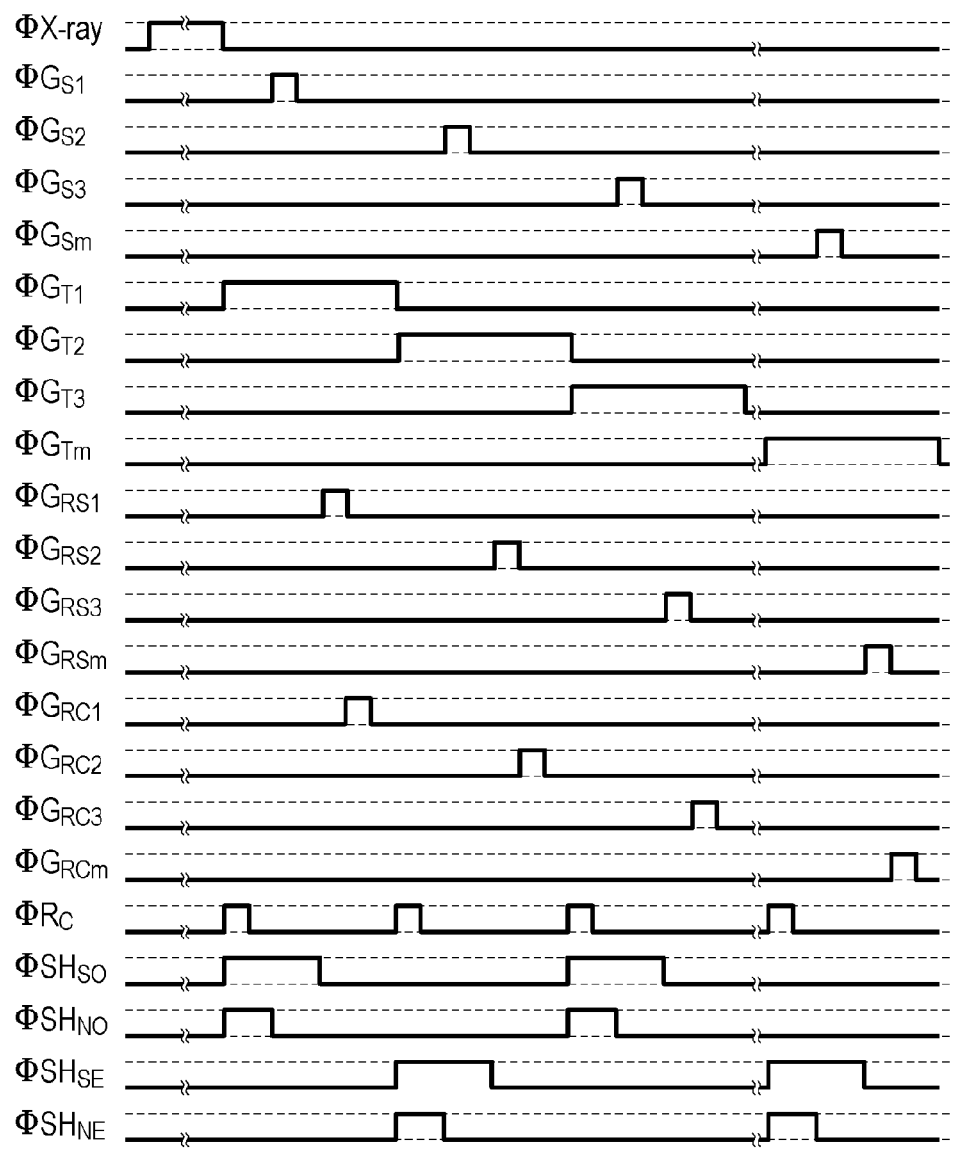
FIG. 3 is an exemplary timing chart of an operation of the detecting apparatus according to the first embodiment.

Next, with reference to FIG. 3, an operation of a detecting apparatus according to this embodiment will be described. FIG. 3 is an exemplary timing chart of an operation of a detecting apparatus according to this embodiment. The timing chart illustrates radiation pulses $\Phi$X-ray of radiant ray, selection drive signals $\Phi G_{S1}$ to $\Phi G_{Sm}$ to be supplied from the drive circuit 30 to selection drive lines $G_{S1}$ to $G_{Sm}$ corresponding to pixels at the first to mth rows, transfer drive signals $\Phi G_{T1}$ to $\Phi G_{Tm}$ to be supplied from the drive circuit 30 to transfer drive lines $G_{T1}$ to $G_{Tm}$ corresponding to pixels at the first to mth rows, reset drive signals $\Phi G_{RS1}$ to $\Phi G_{RSm}$ to be supplied from the drive circuit 30 to reset drive lines $G_{RS1}$ to $G_{RSm}$ corresponding to pixels at the first to mth rows, reset drive signals $\Phi G_{RC1}$ to $\Phi G_{RCm}$ to be supplied from the drive circuit 30 to the capacitance reset drive lines $G_{RC1}$ to $G_{RCm}$ corresponding to pixels at the first to mth rows, a control signal $\Phi R_C$ to be supplied from the control circuit 60 illustrated in FIG. 1B to the reset switch $R_C$ in the amplifier circuit 41 illustrated in FIG. 1C, a control signal $\Phi SH_{SO}$ to be supplied from the control circuit 60 to the S/H circuit for odd-numbered row signals in the amplifier circuit 41, control signals $\Phi SH_{SE}$ to be supplied from the control circuit 60 to a S/H circuit for even-numbered row signals in the amplifier circuit 41, a control signal $\Phi SH_{NO}$ to be supplied from the control circuit 60 to the S/H circuit for odd-numbered row noise in the amplifier circuit 41, and a control signal $\Phi SH_{NE}$ to be supplied from the control circuit 60 to the S/H circuit for even-numbered row noise in the amplifier circuit 41.

As illustrated in FIG. 3, after the detecting apparatus is irradiated with the $\Phi$X-ray, an operation which will be described below is performed row by row. First, the transfer drive signal $\Phi G_{T1}$ is supplied from the drive circuit 30 illustrated in FIG. 1B to the transfer drive line $G_{T1}$ for the first row. Thus, the transfer thin film transistors $T_T$, illustrated in FIG. 1A, included in the pixels $P_{11}$ to $P_{1n}$ at the first row illustrated in FIG. 1B are brought into conduction. The control signal $\Phi R_C$ is supplied from the control circuit 60 illustrated in FIG. 1B to the reset switch $R_C$ in the amplifier circuit 41 illustrated in FIG. 1C to reset the amplifier circuit 41 and signal line 22. The control signal $\Phi SH_{NO}$ is supplied from the control circuit 60 to the S/H circuit for odd-numbered row noise. When the transfer thin film transistors $T_T$ has a conduction state, and until the reset of the amplifier circuit 41 and signal line 22 completes, the conduction state of the sampling switch $SH_{NO}$ is maintained. After the completion of the reset of the amplifier circuit 41 and signal line 22, the conduction state of the sampling switch $SH_{NO}$ ends. Thus, an output of the operational amplifier A as a noise component including an offset of the amplification thin film transistor $T_A$ is held in the S/H circuit for odd-numbered row noise. In this case, a control signal may also be supplied to the S/H circuit for odd-numbered row signals, and the conduction state of the sampling switch $SH_{SO}$ may be maintained. After the conduction state of the sampling switch $SH_{NO}$ ends, the transfer thin film transistor $T_T$ has a conduction state, and a selection drive signal $\Phi G_{S1}$ is supplied from the drive circuit 30 to the selection drive line $G_{S1}$ for the first row. Thus, the selection thin film transistors $T_S$ included in the pixels $P_{11}$ to $P_{1n}$ at the first row are brought into conduction. This operation allows charges based on irradiation of radiant rays generated by the sensing elements S included in the $P_{11}$ to $P_{1n}$ at the first row to define the potentials of the gates of the amplification thin film transistors $T_A$, and charges based on the potentials of the gates of the amplification thin film transistors $T_A$ are held in the capacitors $C_P$. The charges held in the capacitors $C_P$ are transferred to the signal line 22 by the transfer thin film transistor $T_T$. The outputs of the operational amplifiers A, which are transferred to the signal line 22 and are amplified in the operational amplifiers A are held in the S/H circuit for odd-numbered row signals. After the conduction state of the sampling switch $SH_{SO}$ ends, a reset drive signal $\Phi G_{RS1}$ is supplied from the drive circuit 30 to the reset drive line $G_{RS1}$ for the first row. This brings the reset thin film transistors $T_{RS}$ included in the pixels $P_{11}$ to $P_{1n}$ at the first row into conduction and resets the potentials of the gates of the amplification thin film transistors $T_A$. After the conduction state of the reset thin film transistors $T_{RS}$ ends, a capacitance reset drive signal $\Phi_{GRC1}$ is supplied from the drive circuit 30 to the capacitance reset drive line $G_{RC1}$ for the first row. This brings the capacitance reset thin film transistors $T_{RC}$ included in the pixels $P_{11}$ to $P_{1n}$ at the first row into conduction and resets one electrode of the capacitors $C_P$. Up to this point, the operation on the pixels $P_{11}$ to $P_{1n}$ at the first row has completed. In the same manner, the control circuit 60 controls the reset switch $R_C$, S/H circuit for even-numbered row noise, and S/H circuit for even-numbered row signals, and the drive circuit controls the pixels $P_{21}$ to $P_{2n}$ at the second row to perform the operation on the pixels $P_{21}$ to $P_{2n}$ at the first row. These operations are sequentially performed on all rows to perform the operations on all pixels.

[Second Embodiment]

Figure 4A:
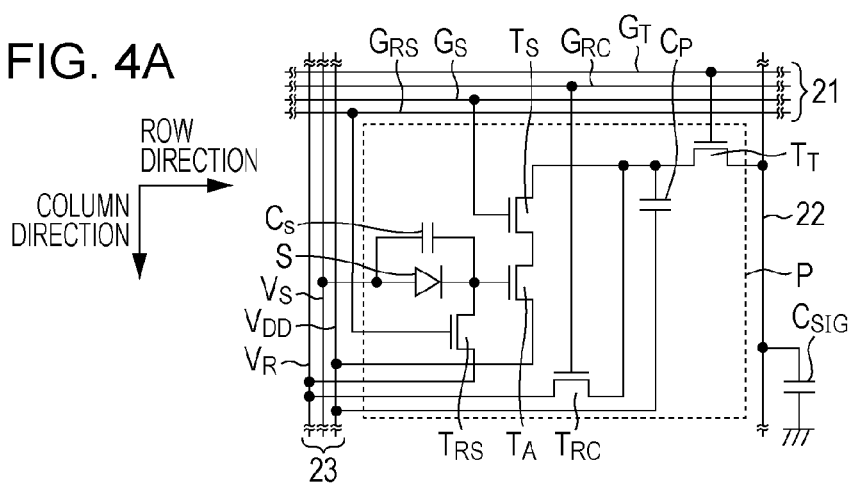
FIG. 4A is a schematic equivalent circuit diagram of one pixel in a detecting apparatus according to a second embodiment.
Figure 4B:
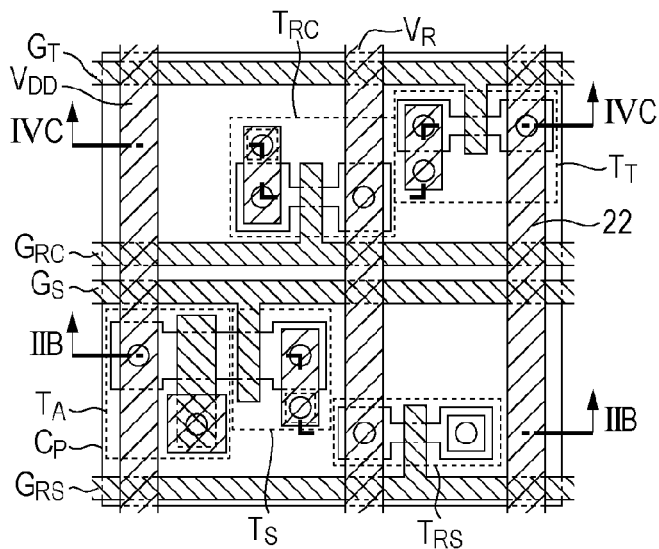
FIG. 4B is a schematic plan view.
Figure 4C:
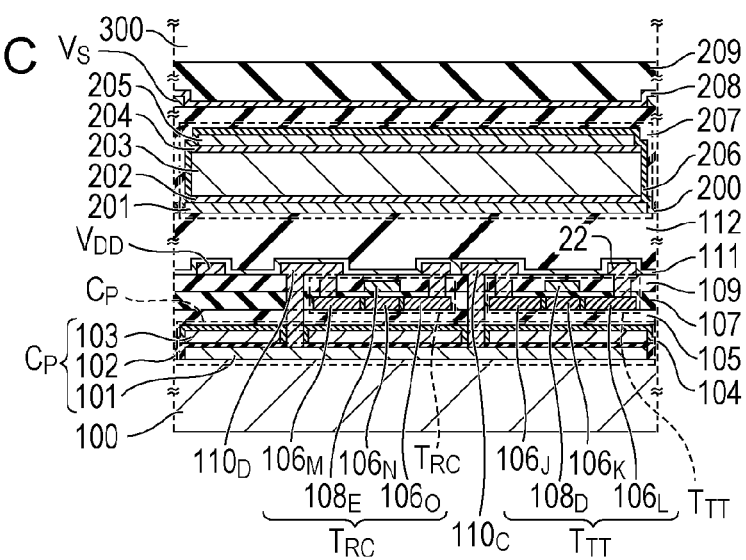
FIG. 4C is a schematic cross-sectional view.
Figure 11:
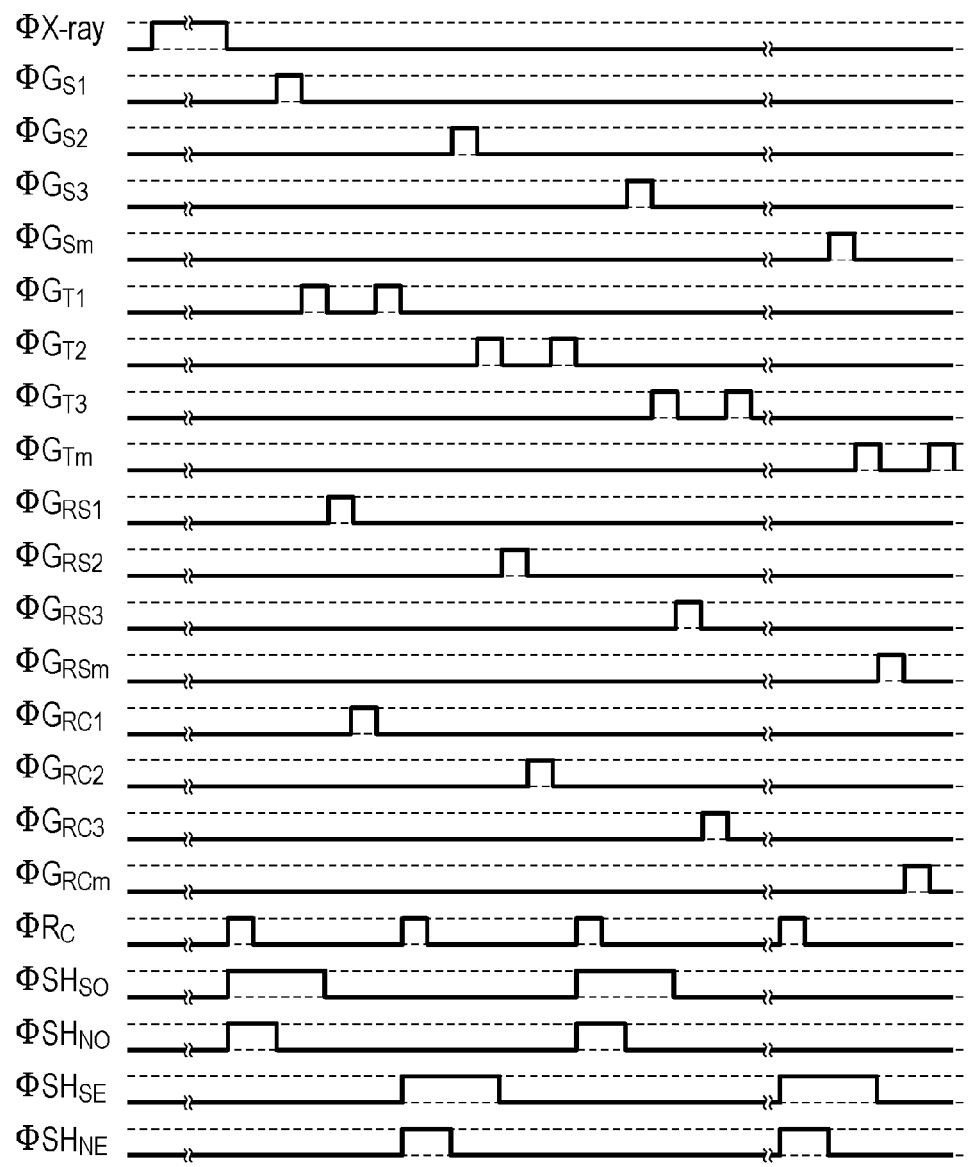
FIG. 11 is an exemplary timing chart of an operation of the detecting apparatus according to the second embodiment.

Next, with reference to FIGS. 4A, 4B, and 4C and FIG. 11, a detecting apparatus according to the second embodiment will be described. Like numbers refer to like parts throughout, and detail description will be omitted. FIG. 4A is a schematic equivalent circuit diagram of one pixel in a detecting apparatus according to the second embodiment. FIG. 4B is a schematic plan view of one pixel in the detecting apparatus according to the second embodiment, and FIG. 4C is a schematic cross-sectional view taken on the IVC-IVC in FIG. 4B. The schematic cross-sectional view taken on the line IIB-IIB in FIG. 4B is the same as that of the first embodiment, the illustration and detail description will be omitted. FIG. 11 is an exemplary timing chart of an operation of a detecting apparatus according to the second embodiment.

According to the first embodiment illustrated in FIG. 1A, one electrode of the capacitor $C_P$ is electrically connected to another one of a source and drain of the amplification thin film transistor $T_A$, and the other electrode of the capacitor $C_P$ is electrically connected to one of the source and drain of the transfer thin film transistor $T_T$. On the other hand, according to this embodiment illustrated in FIG. 4A, one electrode of the capacitor $C_P$ is electrically connected to another one of the source and drain of the amplification thin film transistor $T_A$ and one of the source and drain of the transfer thin film transistor $T_T$. The other electrode of the capacitor $C_P$ is electrically connected to the operating power line $V_{DD}$. Although the other electrode of the capacitor $C_P$ of this embodiment is electrically connected to the operating power line $V_{DD}$, the present embodiment is not limited thereto. The other electrode of the capacitor $C_P$ of this embodiment may only be required to connect to a line to which a predetermined potential may be supplied and may be electrically connected to the reset power supply line $V_R$. Alternatively, a dedicated power supply line may be provided separately. It should be noted that the power supply circuit 50 illustrated in FIG. 1B may be configured to change the potential to be supplied to the reset power supply line $V_R$, which allows handling of the capacitor $C_P$ of this embodiment as a variable capacitance and allows changing the amplification degree of the pixels.

As illustrated in FIGS. 4B and 4C, the operating power line $V_{DD}$ is electrically connected to the second conductive layer 103 through a contact hole in the first passivation layer 104, first interlayer insulating layer 105, gate insulating layer 107, and second interlayer insulating layer 109. The third connection part $110_C$ is electrically connected to the first conductive layer 101 through a contact hole in the first insulating layer 102, second conductive layer 103, first passivation layer 104, first interlayer insulating layer 105, gate insulating layer 107, and second interlayer insulating layer 109. This configuration allows supply of a constant potential to the second conductive layer 103 that is closer to the thin film transistors than the first conductive layer 101. Thus, the capacitor $C_P$ is not susceptible to a change in potential due to operations of the thin film transistors.

The operation of this embodiment is different from the operation of the first embodiment in the following respects, as illustrated in FIG. 11. When the transfer thin film transistor $T_T$ is out of conduction, a selection drive signal $\Phi G_{S1}$ is supplied from the drive circuit 30 to the selection drive line $G_{S1}$ for the first row. This brings the selection thin film transistors $T_S$ included in the pixels $P_{11}$ to $P_{1n}$ at the first row into conduction. This operation allows charges based on irradiation of radiant rays generated by the sensing elements S included in the $P_{11}$ to $P_{1n}$ at the first row to define the potentials of the gates of the amplification thin film transistors $T_A$, and charges based on the potentials of the gates of the amplification thin film transistors $T_A$ are held in the capacitors $C_P$. Then, a transfer drive signal $\Phi G_{T1}$ is supplied from the drive circuit 30 to the transfer drive line $G_{T1}$ for the first row. The transfer thin film transistors $T_T$ illustrated in FIG. 4A included in the pixels $P_{11}$ to P1n at the first row illustrated in FIG. 1B are brought into conduction. Thus, the charges held in the capacitors $C_P$ are transferred to the signal line 22 through the transfer thin film transistors $T_T$.

[Third Embodiment]

Figure 5A:
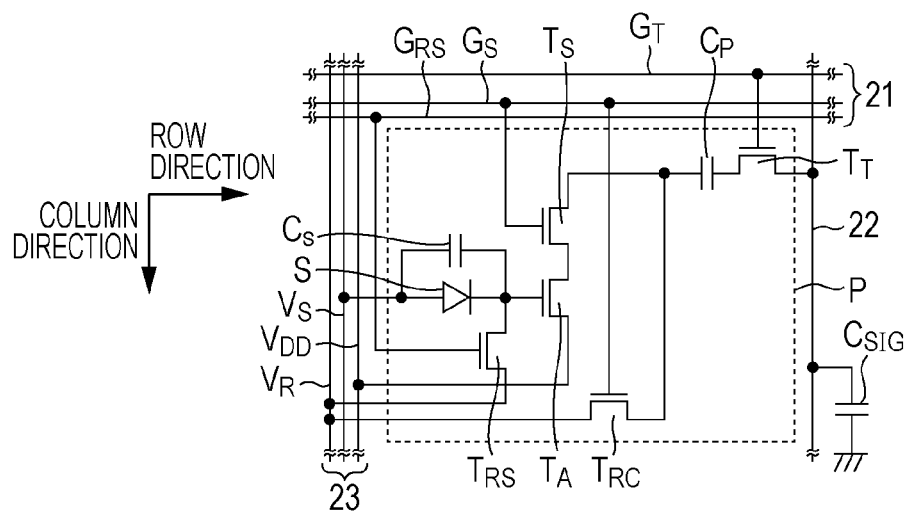
FIG. 5A is a schematic equivalent circuit diagram of one pixel in a detecting apparatus according to a third embodiment.
Figure 5B:
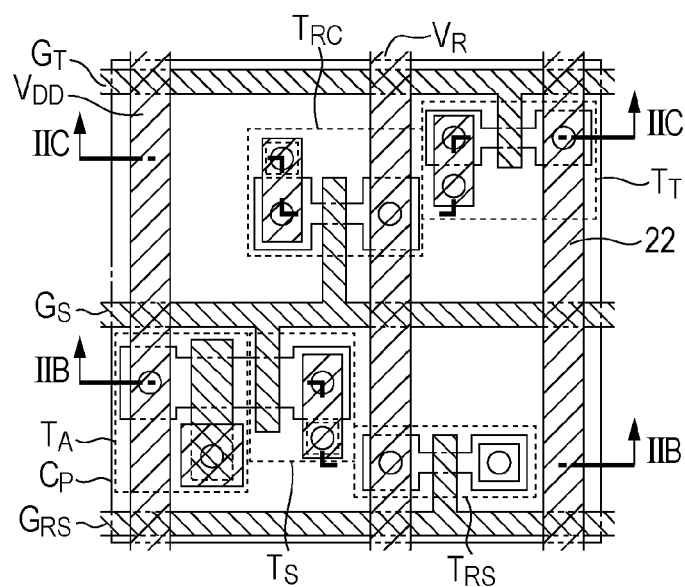
FIG. 5B is a schematic plan view.
Figure 6:
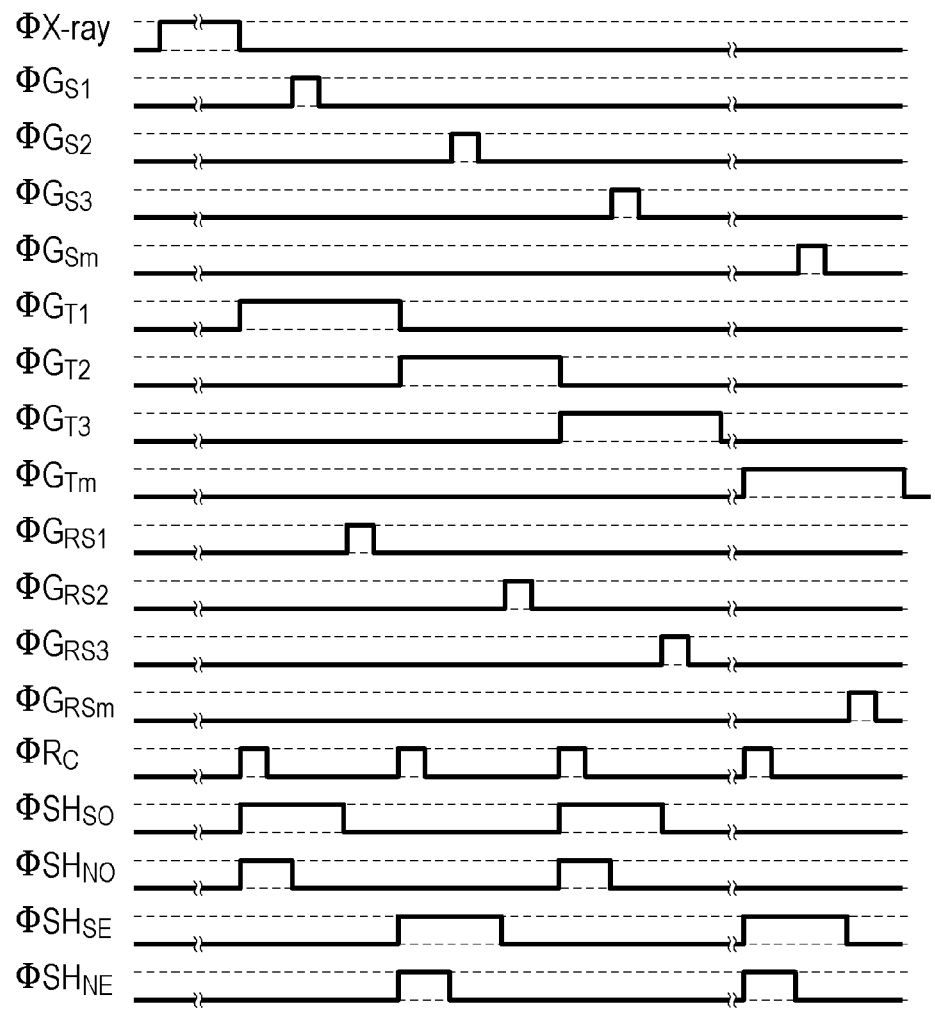
FIG. 6 is an exemplary timing chart of an operation of the detecting apparatus according to the third embodiment.

Next, with reference to FIGS. 5A and 5B and FIG. 6, a detecting apparatus according to the third embodiment will be described. Like numbers refer to like parts in throughout, and detail description will be omitted. FIG. 5A is a schematic equivalent circuit diagram of one pixel of a detecting apparatus according to a third embodiment. FIG. 5B is a schematic plan view of one pixel in a detecting apparatus according to the third embodiment. Because the schematic cross-sectional views are the same as those of the first embodiment, the illustration and detail description will be omitted. FIG. 6 is an exemplary timing chart of an operation of a detecting apparatus according to the third embodiment.

According to the first embodiment illustrated in FIGS. 1A and 2A, the selection thin film transistor $T_S$ has a gate electrically connected to the selection drive line $G_S$, and the capacitance reset thin film transistor $T_{RC}$ has a gate electrically connected to the capacitance reset drive line $G_{RC}$. On the other hand, according to this embodiment illustrated in FIGS. 5A and 5B, the gates of the selection thin film transistor $T_S$ and capacitance reset thin film transistor $T_{RC}$ are commonly electrically connected to the selection drive line $G_S$. In other words, commonality of the capacitance reset drive line $G_{RC}$ and the selection drive line $G_S$ may be achieved. This brings the selection thin film transistor $T_S$ and the capacitance reset thin film transistor $T_{RC}$ into conduction simultaneously as illustrated in FIG. 6, and the capacitance reset thin film transistor $T_{RC}$ may function as a load resistance. Because of the reduced number of lines that intersect with the signal line 22, the parasitic capacitance of the signal line 22 may be reduced.

[Fourth Embodiment]

Figure 7A:
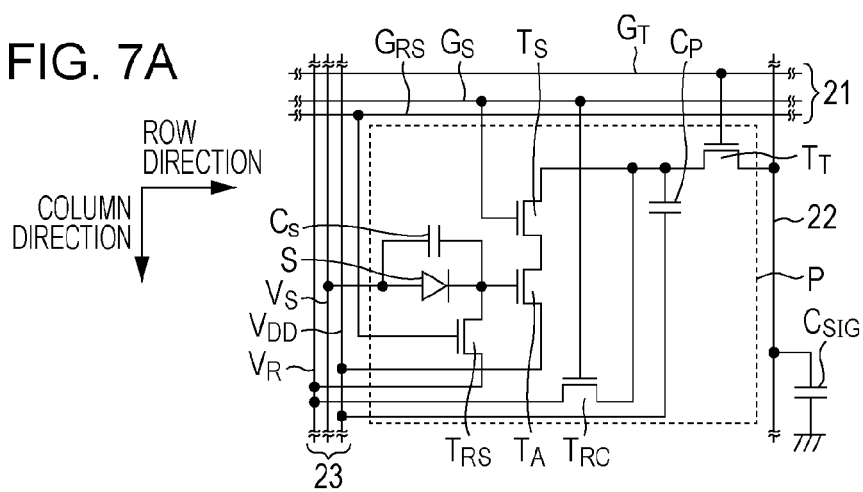
FIG. 7A is a schematic equivalent circuit diagram of one pixel in a detecting apparatus according to a fourth embodiment.
Figure 7B:
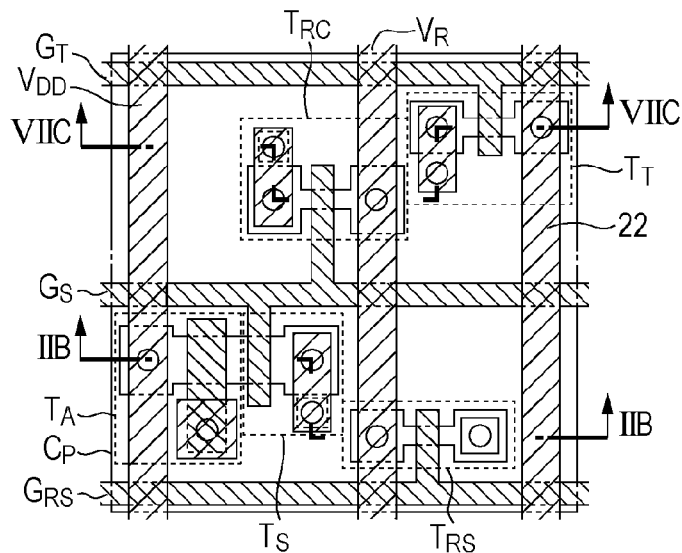
FIG. 7B is a schematic plan view.
Figure 7C:
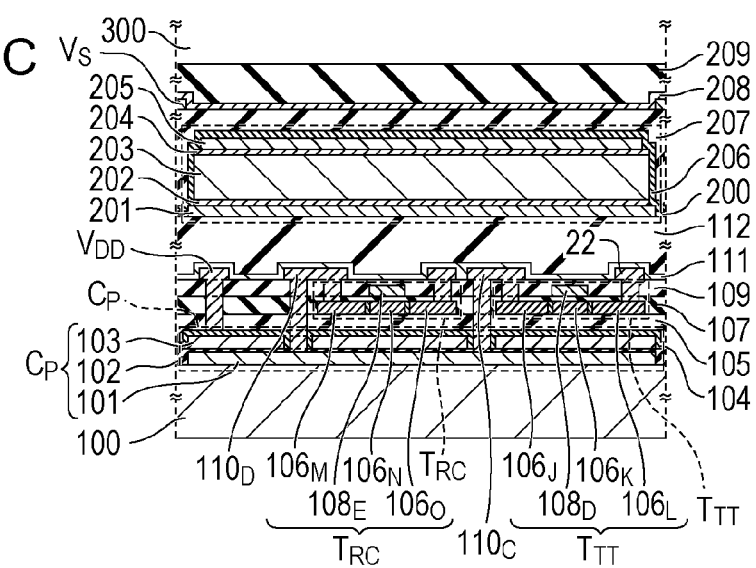
FIG. 7C is a schematic cross-sectional view.

Next, with reference to FIGS. 7A, 7B, and 7C, a detecting apparatus according to a fourth embodiment will be described. Like numbers refer to like parts throughout, and detail description will be omitted. FIG. 7A is a schematic equivalent circuit diagram of one pixel in a detecting apparatus according to a fourth embodiment. FIG. 7B is a schematic plan view of one pixel in a detecting apparatus according to the fourth embodiment. FIG. 7C is a schematic cross-sectional view taken on the line VIIC-VIIC in FIG. 7B. Because the schematic cross-sectional view taken on the line IIB-IIB in FIG. 7B is the same as that of the first embodiment, the illustration and detail description will be omitted.

According to this embodiment illustrated in FIG. 7A, like the second embodiment, the capacitor $C_P$ has one electrode electrically connected to another one of a source and drain of the amplification thin film transistor $T_A$ and one of the source and drain of the transfer thin film transistor $T_T$. The capacitor $C_P$ has the other electrode electrically connected to the operating power line $V_{DD}$. The power supply circuit 50 illustrated in FIG. 1B is configured to change the potential to be supplied to the reset power supply line $V_R$, which allows handling of the capacitor $C_P$ of this embodiment as a variable capacitance and allows changing the amplification degree of the pixel.

As illustrated in FIGS. 7B and 7C, the operating power line $V_{DD}$ is electrically connected to the second conductive layer 103 through a contact hole in the first passivation layer 104, first interlayer insulating layer 105, gate insulating layer 107, and second interlayer insulating layer 109. The third connection part $110_C$ is electrically connected to the first conductive layer 101 through a contact hole in the first insulating layer 102, second conductive layer 103, first passivation layer 104, first interlayer insulating layer 105, gate insulating layer 107, and second interlayer insulating layer 109. This configuration allows supply of a constant potential to the second conductive layer 103 that is closer to the thin film transistors than the first conductive layer 101, like the second embodiment. Thus, the capacitor $C_P$ is not susceptible to a change in potential due to operations of the thin film transistors.

According to this embodiment illustrated in FIGS. 7A and 7B, the gates of the selection thin film transistor $T_S$ and capacitance reset thin film transistor $T_{RC}$ are commonly electrically connected to the selection drive line $G_S$, like the third embodiment. This brings the selection thin film transistor $T_S$ and the capacitance reset thin film transistor $T_{RC}$ into conduction simultaneously, and the capacitance reset thin film transistor $T_{RC}$ may function as a load resistance, like the third embodiment. Because of the reduced number of lines that intersect with the signal line 22, the parasitic capacitance of the signal line 22 may be reduced.

[Fifth Embodiment]

Figure 8:
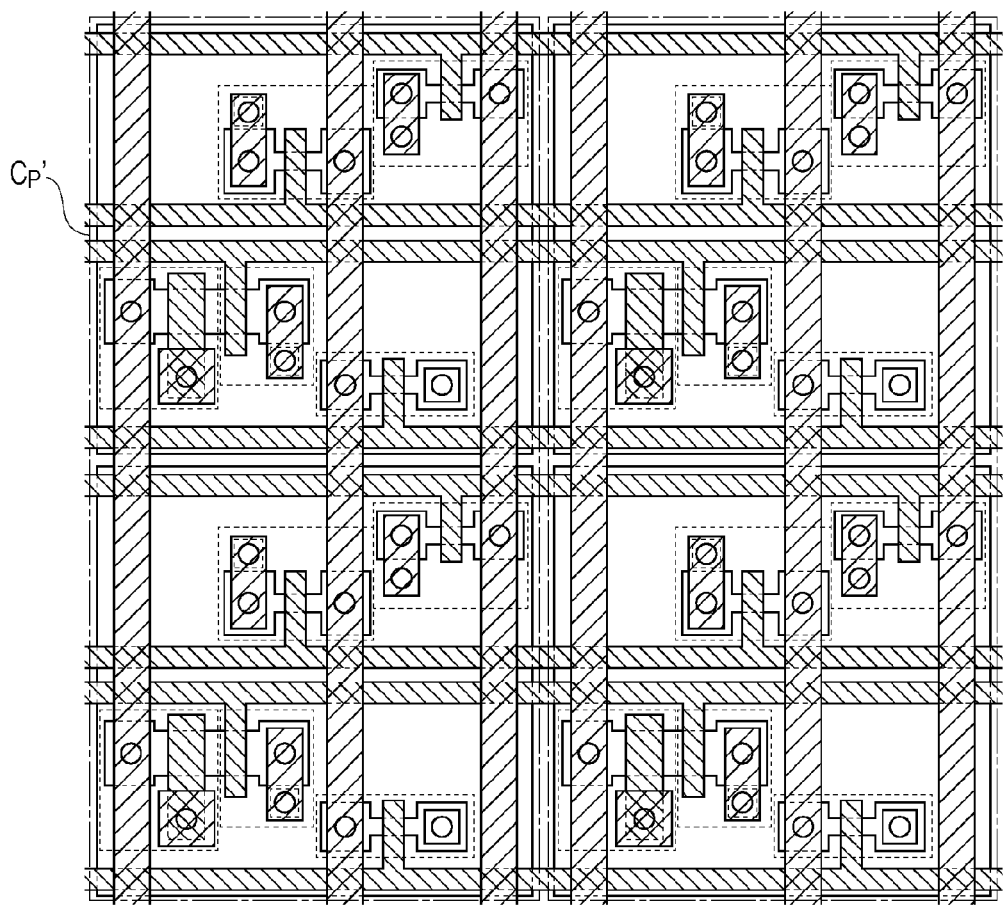
FIG. 8 is a schematic plan view if a detecting apparatus according to a fifth embodiment.

Next, with reference to FIG. 8, a detecting apparatus according to a fifth embodiment will be described. FIG. 8 is a schematic plan view of pixels in two rows and two columns in a detecting apparatus according to the fifth embodiment.

According to the first embodiment illustrated in FIG. 2A, one capacitor $C_P$ is provided for one pixel P. On the other hand, according to this embodiment illustrated in FIG. 8, one capacitor $C_P'$ is commonly provided for two pixels. This configuration allows easy preparation of a capacitor having a high capacitance even for a smaller pixel size. According to this embodiment, one capacitor $C_P'$ is commonly provided for two pixels at two serial rows. However, the present embodiment is not limited thereto, but it may only be required that one capacitor $C_P'$ is provided for 2 or more pixels. Referring to FIG. 8, each pixel has the transfer thin film transistor $T_T$. However, one transfer thin film transistor $T_T$ may be provided for a plurality of pixels having a common capacitor $C_P$.

[Sixth Embodiment]

Figure 9A:
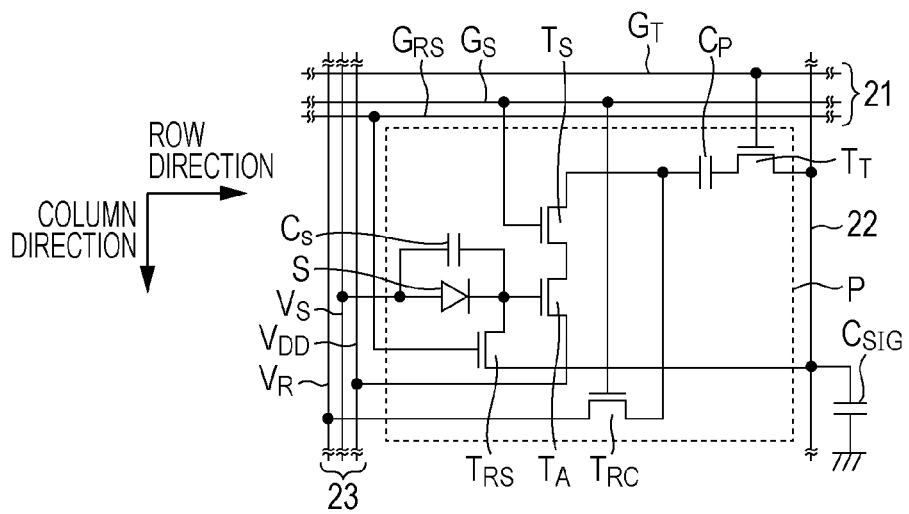
FIGS. 9A and 9B are schematic equivalent circuit diagrams of one pixel in a detecting apparatus according to a sixth embodiment.
Figure 9B:
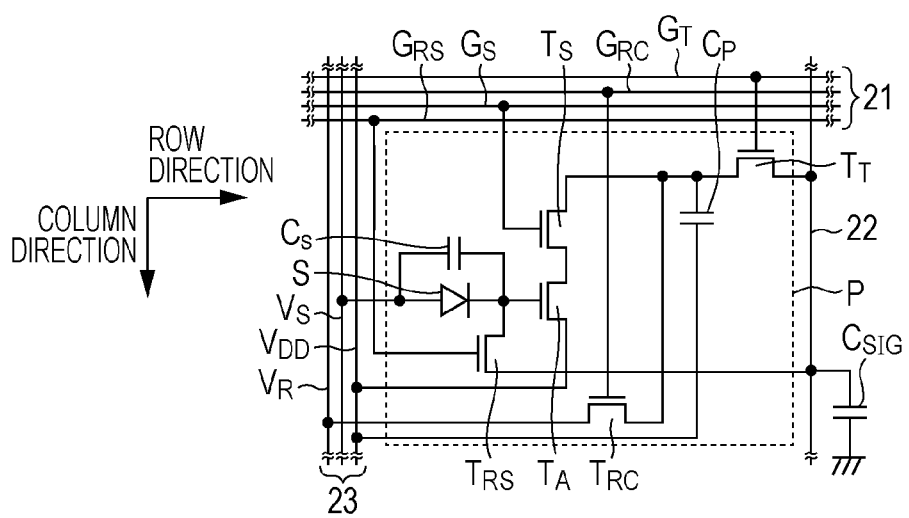

With reference to FIGS. 9A and 9B, a detecting apparatus according to a sixth embodiment will be described. Like numbers refer to like parts throughout, and detail description will be omitted. FIG. 9A is a schematic equivalent circuit diagram of one pixel in a detecting apparatus according to a sixth embodiment. FIG. 9B is a schematic equivalent circuit diagram of one pixel in a detecting apparatus in another example according to the sixth embodiment.

According to the first embodiment illustrated in FIG. 1A, one of the source and drain of the reset thin film transistor $T_{RS}$ is provided in the reset power supply line $V_R$. On the other hand, according to this embodiment illustrated in FIG. 9A, one of the source and drain of the reset thin film transistor $T_{RS}$ is electrically connected to the signal line 22. The reset thin film transistor $T_{RS}$ connected in that manner may output an electric signal based on the amount of the electric charges generated in a sensing element through the reset thin film transistor $T_{RS}$. This configuration allows selection of either path for transferring an electric signal amplified in the amplification thin film transistor $T_A$ from the pixel to the signal line 22 through the transfer thin film transistor $T_T$ or path for transferring an electric signal based on the amount of the electric charges generated in the sensing element from the pixel to the signal line 22 through the reset thin film transistor $T_{RS}$. In another example illustrated in FIG. 9B, one of the source and drain of the reset thin film transistor $T_{RS}$ is electrically connected to the signal line 22, compared with the second embodiment illustrated in FIG. 4A. In this circuit, the voltage that may be supplied to the electrode power supply line $V_S$ and the voltage of the reference power supply Vref1 may be adjusted properly for a preferable operation.

[Applied Embodiments]

Figure 10:
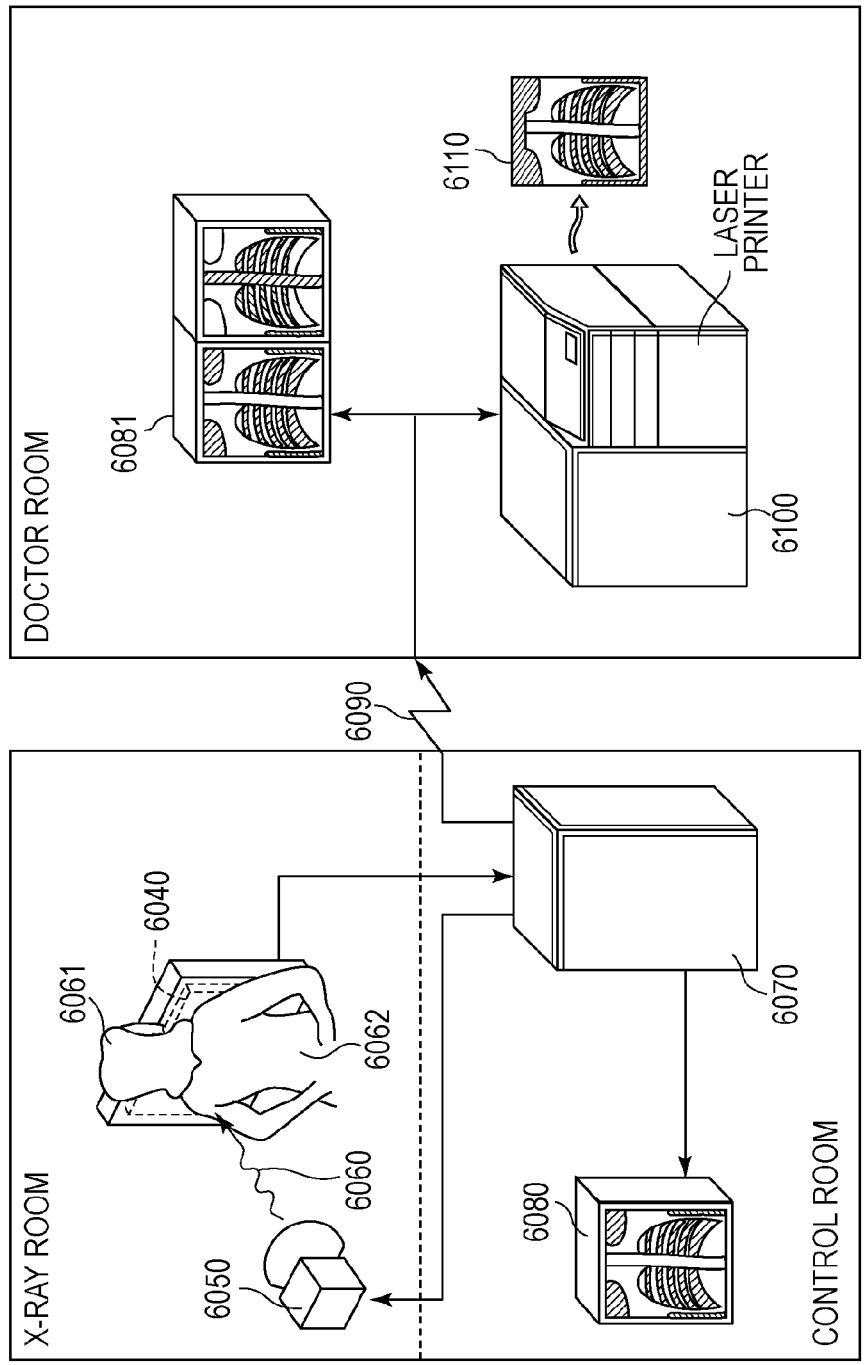
FIG. 10 is a schematic diagram illustrating an example of application of a detecting apparatus to a detecting system.

Next, with reference to FIG. 10, a radiant ray detecting system including a detecting apparatus will be described.

An X-ray 6060 that is a radiant ray generated in an X-ray tube 6050 that is a radiation source passes through a chest 6062 of a patient or subject 6061 and enters to a sensing element included in the detecting apparatus 6040. The incident X-ray contains biological information on the patient 6061. In response to the incident X-ray, a converting unit 3 converts the radiant ray to electric charges to acquire electrical information. The information is converted to digital data, which undergoes image processing by an image processor 6070 that is a signal processing unit. The result of the image processing may be observed on a display 6080 that is a display unit in a control room.

This information may also be transferred to a remote location through a transmission processing unit such as a telephone line 6090 so that it may be displayed on a display 6081 that is a display unit in a doctor room, for example, at a different location or may be saved in a recording unit such as an optical disk so that a doctor at a remote location may perform a diagnosis with it. Alternatively, the information may be recorded by a film processor 6100 that is a recording unit on a film 6110 that is a recording medium.

While the present disclosure has been described with reference to exemplary embodiments, these embodiments are not seen to be limiting. The scope of the following claims is to be accorded the broadest interpretation so as to encompass all such modifications and equivalent structures and functions.

This application claims the benefit of Japanese Patent Application No. 2012-224238 filed Oct. 9, 2012 and No. 2013-174676 filed Aug. 26, 2013, which are hereby incorporated by reference herein in their entirety.

What is claimed is:

1. A detecting apparatus formed on a substrate, the detecting apparatus comprising:
   a plurality of pixels arranged in a matrix; and
   a signal line electrically connected to the pixels, wherein each of the pixels includes:
   a sensing element that converts radiant ray or light to electric charges,
   an amplification thin film transistor that outputs an electric signal based on an amount of the electric charges,
   a capacitor that holds an electric signal output by the amplification thin film transistor, and
   a transfer thin film transistor that transfers an electric signal held in the capacitor to the signal line.

2. The detecting apparatus according to claim 1, wherein the capacitor is placed between the amplification thin film transistor and the transfer thin film transistor and the substrate.

3. The detecting apparatus according to claim 1, wherein a capacitance of the capacitor is 3 to 10 times of a capacitance of the sensing element and is 1/30 to 1/10 of the parasitic capacitance of the signal line.

4. The detecting apparatus according to claim 1, wherein the amplification thin film transistor and the transfer thin film transistor are thin film transistors of polycrystalline silicon,
   the capacitor includes a first conductive layer placed on the substrate, an insulating layer placed on the first conductive layer, and a second conductive layer placed on the insulating layer, and
   the insulating layer contains silicon nitride.

5. The detecting apparatus according to claim 4, further comprising a passivation layer and an interlayer insulating layer placed between the amplification thin film transistor and the transfer thin film transistor and the capacitor, wherein the passivation layer and the interlayer insulating layer contain silicon nitride, and the interlayer insulating layer is thicker than the insulating layer.

6. The detecting apparatus according to claim 5, wherein the thickness of the interlayer insulating layer is 6 to 20 times of the thickness of the insulating layer.

7. The detecting apparatus according to claim 4, further comprising:
an electrode power supply line electrically connected to one electrode of the sensing element;
an operating power line electrically connected to one of a source and a drain of the amplification thin film transistor; and
a transfer drive line connected to a gate of the transfer thin film transistor, wherein
the amplification thin film transistor has a gate electrically connected to another electrode of the sensing element,
the first conductive layer is electrically connected to another one of a source and drain of the amplification thin film transistor, and the second conductive layer is electrically connected to one of a source and a drain of the transfer thin film transistor, and
another one of source and drain of the transfer thin film transistor is electrically connected to the signal line.

8. The detecting apparatus according to claim 7, wherein
each of the pixels further includes a reset thin film transistor that resets a gate of the amplification thin film transistor, a selection thin film transistor that selects the pixel, and a capacitance reset thin film transistor that resets the capacitor,
the reset thin film transistor has one of a source and a drain electrically connected to a reset power supply line, and another one of a source and drain electrically connected to a gate of the amplification thin film transistor,
the selection thin film transistor has one of a source and a drain electrically connected to the another one of the source and drain of the amplification thin film transistor, and the another one of the source and drain of the selection thin film transistor is electrically connected to the first conductive layer, and
the capacitance reset thin film transistor has one of a source and a drain electrically connected to a line to which a predetermined potential may be supplied, and the capacitance reset thin film transistor has another one of a source and drain electrically connected to the first conductive layer.

9. The detecting apparatus according to claim 8, wherein the first conductive layer and the second conductive layer contain an optical transparent conductive material.

10. The detecting apparatus according to claim 8, further comprising:
a selection drive line electrically connected to a gate of the selection thin film transistor;
a reset drive line electrically connected to a gate of the reset thin film transistor;
a drive circuit electrically connected to the transfer drive line and the selection drive line; and
a readout circuit electrically connected to the signal line; and
a control circuit that controls the drive circuit and the readout circuit, wherein
the readout circuit includes a reset switch that resets the signal line, an operational amplifier electrically connected to the signal line, and a sample hold circuit electrically connected to the operational amplifier;
the sample hold circuit includes a signal sample hold circuit and a noise sample hold circuit; and
the control circuit controls the drive circuit and the readout circuit such that the noise sample hold circuit may hold an output of the operational amplifier when the transfer thin film transistor has a conduction state after the signal line is reset by the reset switch, and the signal sample hold circuit may hold an output of the operational amplifier after the transfer thin film transistor is brought into conduction and the transfer thin film transistor is brought into conduction after the noise sample hold circuit holds an output of the operational amplifier.

11. The detecting apparatus according to claim 10, wherein the capacitance reset thin film transistor has a gate electrically connected to the selection drive line.

12. The detecting apparatus according to claim 4, further comprising:
an electrode power supply line electrically connected to one electrode of the sensing element;
an operating power line electrically connected to one of a source and a drain of the amplification thin film transistor; and
a transfer drive line connected to a gate of the transfer thin film transistor, wherein
the amplification thin film transistor has a gate electrically connected to another electrode of the sensing element,
the first conductive layer is electrically connected to the another one of the source and drain of the amplification thin film transistor and one of a source and a drain of the transfer thin film transistor,
the second conductive layer is electrically connected to a line to which a predetermined potential may be supplied, and
the another one of the source and drain of the transfer thin film transistor is electrically connected to the signal line.

13. The detecting apparatus according to claim 12, further comprising a power supply circuit electrically connected to the line to which a predetermined potential may be supplied, and the power supply circuit is configured to change the potential to be supplied to the line to which a predetermined potential may be supplied.

14. The detecting apparatus according to claim 12, wherein
each of the pixels further includes a reset thin film transistor that resets a gate of the amplification thin film transistor, a selection thin film transistor that selects the pixel, and a capacitance reset thin film transistor that resets the capacitor,
the reset thin film transistor has one of a source and a drain electrically connected to a reset power supply line, and another one of a source and drain is electrically connected to a gate of the amplification thin film transistor,
selection thin film transistor has one of a source and a drain electrically connected to the another one of the source and drain of the amplification thin film transistor, and the selection thin film transistor has the another one of the source and drain electrically connected to the first conductive layer,
the capacitance reset thin film transistor has one of a source and a drain electrically connected to a line to which a predetermined potential may be supplied, and
the capacitance reset thin film transistor has another one of a source and drain electrically connected to the first conductive layer.

15. The detecting apparatus according to claim 14, wherein the first conductive layer and the second conductive layer contain an optical transparent conductive material.

16. The detecting apparatus according to claim 14, further comprising:
a selection drive line electrically connected to a gate of the selection thin film transistor;
a reset drive line electrically connected to a gate of the reset thin film transistor;

a drive circuit electrically connected to the transfer drive line and the selection drive line;

a readout circuit electrically connected to the signal line; and a control circuit that controls the drive circuit and the readout circuit, wherein the readout circuit includes a reset switch that resets the signal line, an operational amplifier electrically connected to the signal line, and a sample hold circuit electrically connected to the operational amplifier, the sample hold circuit includes a signal sample hold circuit and a noise sample hold circuit, and the control circuit controls the drive circuit and the readout circuit such that the noise sample hold circuit may hold an output of the operational amplifier when the transfer thin film transistor has a conduction state after the signal line is reset by the reset switch and the signal sample hold circuit may hold an output of the operational amplifier after the transfer thin film transistor is brought into conduction and the transfer thin film transistor is brought into conduction after the noise sample hold circuit holds an output of the operational amplifier.

17. The detecting apparatus according to claim 16, wherein the capacitance reset thin film transistor has a gate electrically connected to the selection drive line.

18. A detecting system comprising:

the detecting apparatus according to claim 1;

a signal processing unit that processes a signal from the detecting apparatus;

a display unit that displays a signal from the signal processing unit; and a transmission processing unit configured to transmit a signal from the signal processing unit.

* * * * *